United States Patent

Huang et al.

[11] Patent Number: 5,668,038
[45] Date of Patent: Sep. 16, 1997

[54] ONE STEP SMOOTH CYLINDER SURFACE FORMATION PROCESS IN STACKED CYLINDRICAL DRAM PRODUCTS

[75] Inventors: Yuan-Chang Huang; Chen-Jong Wang; Mong-Song Liang, all of Hsin-Chu, Taiwan

[73] Assignee: Taiwan Semiconductor Manufacturing Company, Ltd., Hsin-Chu, Taiwan

[21] Appl. No.: 728,021

[22] Filed: Oct. 9, 1996

[51] Int. Cl.$^6$ .............................................. H01L 21/8242
[52] U.S. Cl. ...................... 438/396; 438/397; 438/719; 438/723
[58] Field of Search ..................... 437/47, 52, 60, 437/919, 228 PE, 228 SE

[56] References Cited

U.S. PATENT DOCUMENTS

| | | | |
|---|---|---|---|
| 5,219,780 | 6/1993 | Jun | 437/52 |
| 5,354,705 | 10/1994 | Mathews et al. | 437/52 |
| 5,401,681 | 3/1995 | Dennison | 437/60 |
| 5,449,636 | 9/1995 | Park et al. | 437/52 |
| 5,539,231 | 7/1996 | Suganaga et al. | 257/306 |

*Primary Examiner*—Jey Tsai
*Attorney, Agent, or Firm*—George O. Saile; William J. Stoffel

[57] ABSTRACT

A method of fabrication of a DRAM cell, which forms an improved smooth top cylinder surface and provides controllable cylinder height. A semiconductor structure is provided having a transistor. Also provided are a barrier layer 12 over a first insulating layer 11 on the semiconductor structure. A polysilicon plug 14 extends through the barrier layer 12 and the insulating layer 11. A second insulating layer 16 is formed over portions of the barrier layer 12 and has an opening over the polysilicon plug 14 and over portions of the barrier layer adjacent to the polysilicon plug 14. A polysilicon layer 18 is formed over the second insulating layer 16, the sidewalls of the second insulating layer 16, the portions of the barrier layer 12 adjacent to the polysilicon plug 14 and over the polysilicon plug 14. A gap filling third insulating layer 20 is formed over the polysilicon layer 18. In an important process, potions of the gap filling third insulating layer 20 and the polysilicon layer 18 are etched back in an one step etch process to form a polysilicon cylinder 22. The critical one step etch processes is comprised of two stages: (1) an insulating layer etch stage and (2) a polysilicon etch stage. The second insulating layer 16 and the third insulating layer 20 are then removed thereby formed a stacked polysilicon cylinder.

21 Claims, 6 Drawing Sheets

5,668,038

ONE STEP SMOOTH CYLINDER SURFACE FORMATION PROCESS IN STACKED CYLINDRICAL DRAM PRODUCTS

BACKGROUND OF THE INVENTION

1. Field of Invention

The present invention relates to a method of fabricating a semiconductor memory cell and particularly to a method for forming a polysilicon cylindrical capacitor in a stacked DRAM cell.

2. Description of Prior Art

A dynamic random access memory (DRAM) cell is a semiconductor memory device with one transistor and one capacitor, in which a data of one-bit can be stored in the capacitor by the charge stored therein. As the density of DRAM cells increases, the area occupied by the one memory cell decreases. Therefore, the present invention is devoted to the manufacture of a capacitor with a maximum capacity in a limited area with a minimum number of etch steps.

Semiconductor technologies have dramatically increased the circuit density on a chip. The miniaturized devices built in and on semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs).

Current capacitor process are complicated, costly, and produce less than optimal rough polysilicon surfaces. For example, a conventional process for etching back dielectric and conductive layers over a cylinder capacitor electrode entail separate etch steps for etch type of layer etched and pre-cleans between each etch step. Moreover, current etch processes do not maintain good control over cylinder heights. The conventional processes require that the wafers be moved from one etcher (e.g., $SiO_2$ etcher) to a wet pre-clean station and then to another etcher (e.g., PolySi etcher). This added cost and slows down the manufacturing process.

The prior art process degrades the performance (oxide/nitride/oxide (ONO) layer breakdown voltage) of the dielectric (ONO) layer because they produce a rough silicon surface. Typical polysilicon etches generate rough polysilicon surfaces. Rough polysilicon will create an antenna like surface which may result in a low ONO breakdown voltage. The conventional process needs special treatment to smooth the polysilicon surface or increase the ONO thickness to maintain the required breakdown voltage. However, a thicker ONO layer lowers capacitance.

Practitioners have tried to solve the problems of polysilicon cylinder fabrication. U.S. Pat. No. 5,219,780 (Jun) and U.S. Pat. No. 5,449,636 (Park) use 3 step processes to form a cylindrical capacitor. However, these processes can be further improved.

SUMMARY OF THE INVENTION

It is an object of the present invention to simplify the method of fabrication of a DRAM cell, which provides a smoother cylinder surface and controllable cylinder height.

It is an object of the present invention to simplify the method of fabrication of a DRAM cell, by providing a one step silicon oxide layer and polysilicon layer etch and achieving the required smooth polysilicon surface required thereby improving the ONO performance.

To accomplish the above objective, the present invention provides a method of forming a polysilicon cylinder in a DRAM cell. The semiconductor structure is provided having a transistor, comprising a source, drain and gate, on a substrate. Also provided is a barrier layer 12 over a first insulating layer 11 on the semiconductor structure. A polysilicon plug 14 extends through a plug opening in the barrier layer 12 and the insulating layer 11. A second insulating layer 16 is formed over portions of the barrier layer 12. The second insulating layer 16 has an opening over the polysilicon plug 14 and over portions of the barrier layer adjacent to the polysilicon plug 14. The opening is defined by sidewalls of the second insulating layer 16. A polysilicon layer 18 is formed over the second insulating layer 16, the sidewalls of the second insulating layer 16, the portions of the barrier layer 12 adjacent to the polysilicon plug 14 and over the polysilicon plug 14. A gap filling third insulating layer 20 is formed over the polysilicon layer 18. In an important process, portions of the gap filling third insulating layer 20 and the polysilicon layer 18 are etched back in an one step etch process to form a polysilicon cylinder 22. The critical one step etch processes is comprised of two stages: (1) an insulating layer etch stage and (2) a polysilicon etch stage. The insulating layer etch stage is performed using a plasma enhanced etch using $CHF_3$, $CF_4$, and Argon gasses. The polysilicon etch stage is performed using $CF_4$, $SF_6$, and Argon gasses. The second insulating layer 16 and the third insulating layer 20 are then removed thereby forming a stacked polysilicon cylinder. Subsequently a capacitor dielectric layer and a top electrode plate are formed over the polysilicon cylinder thereby forming the DRAM cell of the invention.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar of corresponding elements, regions and portions and in which.

DETAILED DESCRIPTION OF THE PREFERRED EMBODIMENTS

The present invention provides a method of forming a polysilicon cylinder in a DRAM cell. The method provides a one step silicon oxide and polysilicon layer etch.

Figure 1:
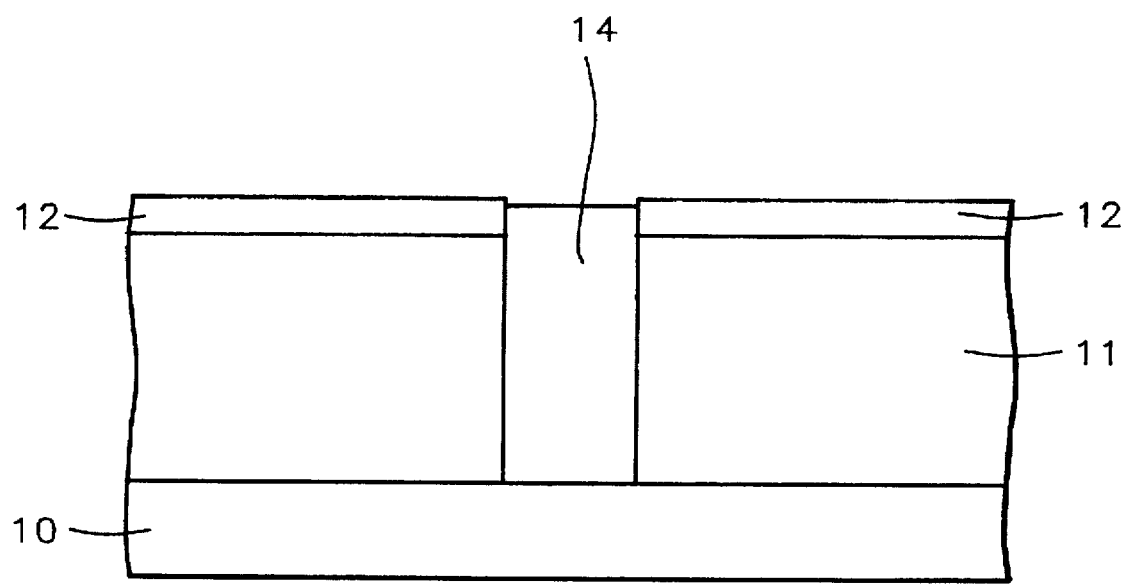
FIGS. 1 through 6 are cross sectional views for illustrating a method for forming polysilicon cylinder in a DRAM cell according to the present invention.
Figure 7:
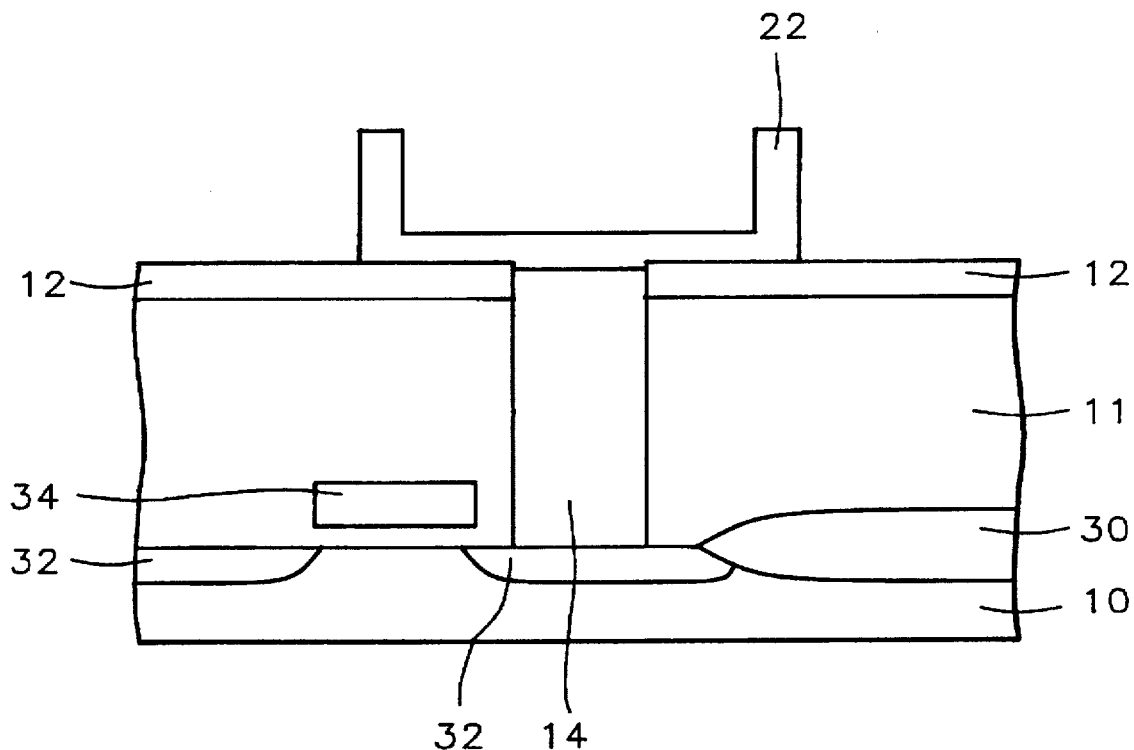
FIG. 7 is a cross sectional view for illustrating a method for forming a polysilicon cylinder in a completed DRAM cell according to the present invention.

The invention begins by providing a semiconductor structure (e.g., 10 11 30 32 34) including a semiconductor substrate 10 as shown in FIGS. 1 and 7. The semiconductor structure comprises a substrate and any semiconductor devices form in or on the substrate including, source/drain regions, gate electrodes, insulating and conductive layers. The semiconductor structure is provided preferably having a transistor, comprising a source/drain 32 and gate 34, on a substrate 10. Also provided are a barrier layer 12 over a first insulating layer 11 on the semiconductor structure. The insulating layer 11 is preferably formed of silicon oxide and preferably has a thickness of between about 10,000 and 13,000 Å. The barrier layer 12 is preferably formed of silicon nitride and preferably has a thickness of between about 500 and 1500 Å.

Next, a plug opening is formed in the barrier layer 12 and the insulating layer 11 exposing the substrate surface. A polysilicon plug 14 is then formed in the plug opening contacting the source region 32.

Figure 2:
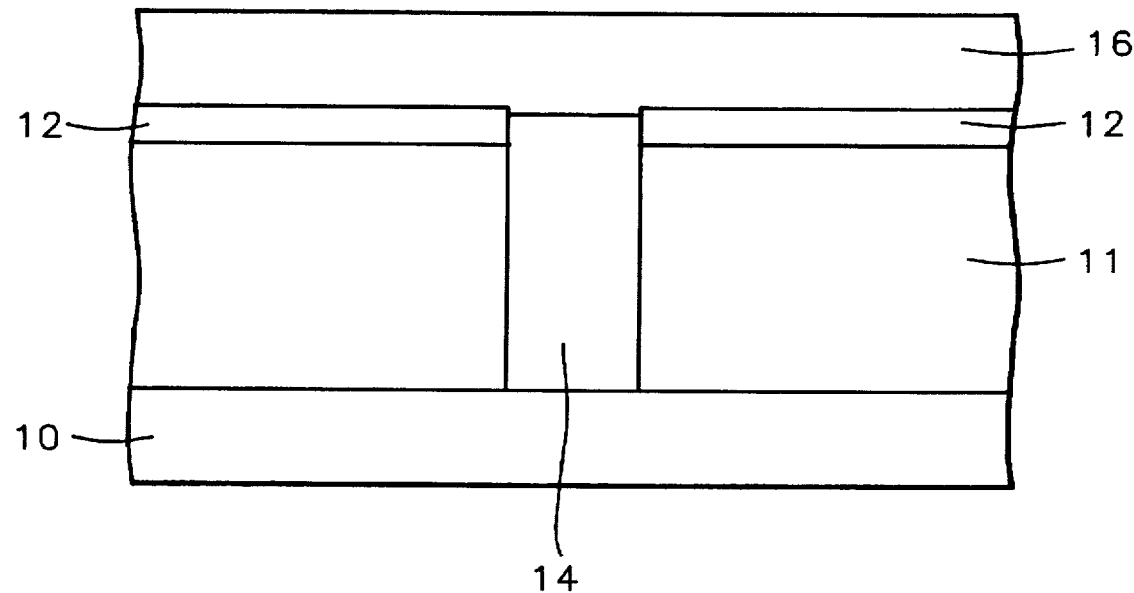

As shown in FIG. 2, a second insulating layer 16 is formed over the barrier layer 12 and the polysilicon plug 14. The second insulating layer 16 is preferably formed of silicon oxide and deposited by plasma enhanced tetraethylorthosilicate (PETEOS).

This plasma TEOS oxide layer is preferably deposited using TEOS gas at a flow rate of between about 200 and 300 sccm and oxygen at a flow rate of between about 800 and 1200 sccm, an electrode spacing of between about 255 and 275 mils and more preferably 265 mils, at a pressure of between about 7 and 8 Torr, at a temperature of between about 400° and 450° C., at a power of between about 500 and 600 W. The second insulating layer 16 preferably has a thickness of between about 4000 and 6000 Å. The thickness of the second insulating layer largely determines the polysilicon cylinder height.

Figure 3:
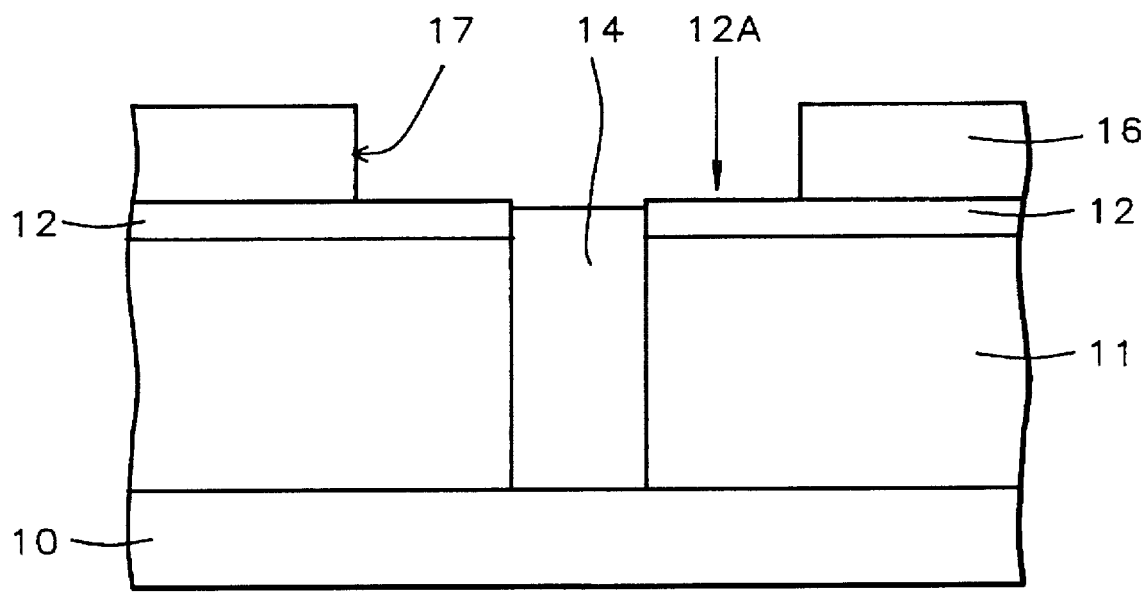
Figure 4:
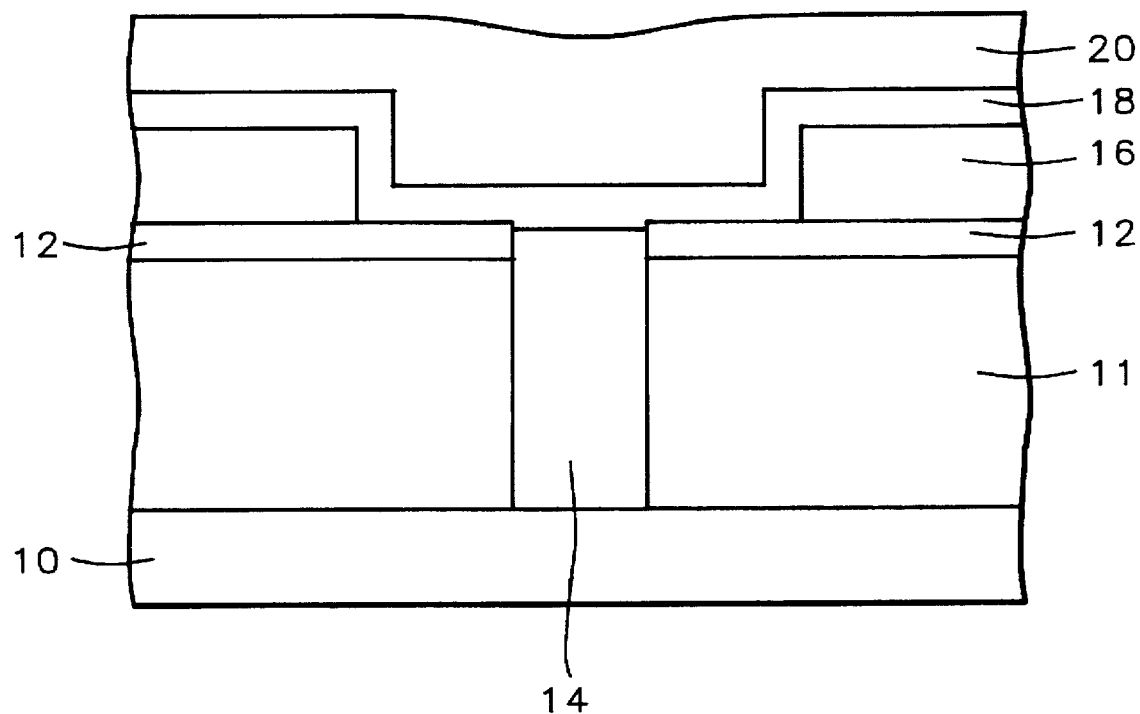

As shown in FIG. 3, etching the second insulating layer 16 is etched forming a cylindrical opening 17 over the polysilicon plug 14 and exposing portions 12A of the barrier layer 12. The second insulating layer 16 preferably is removed by anisotropic reactive ion etching with Argon (Ar)+carbon tetrafluoride ($CF_4$)+Nitrogen ($N_2$), at a pressure of between about 275 and 330 mTorr, at a power of between about 1250 and 1350 watts, using $CF_4$ at a flow rate of between about 75 and 85 sccm, using Ar at a flow rate of between about 550 and 650 sccm, and using $N_2$ at a flow rate of between about 90 and 110 sccm and an electrode spacing of between about 0.9 and 1.1 cm. The cylindrical hole 17 is preferably formed by using conventional photolithographic techniques As shown in FIG. 4, a polysilicon layer 18 is deposited over the second insulating layer 16, the polysilicon plug 14, and over exposed portions 12A of the barrier layer 12. The polysilicon layer 18 preferably has a thickness of between about 800 and 1200 Å and more preferably 1000 Å. The polysilicon layer can be deposited by pyrolysing silane in a low pressure chemical vapor deposition process at about 620 C.

Still referring to FIG. 4, a gap filling third insulating layer (non-conformal) 20 is deposited over the polysilicon layer 18. The gap filling third insulating layer is preferably composed of silicon oxide and is deposited by plasma enhanced tetraethylorthosilieate (PETEOS). This plasma tetraethylorthosilicate (TEOS) oxide layer is preferably deposited using TEOS gas at a flow rate of between about 200 and 300 sccm and helium flow rate of between about 800 and 1200 sccm, an electrode spacing of between about 255 and 275 mils and more preferably 265 mils, at a pressure of between about 7 and 8 Torr, at a temperature of between about 400° and 450° C., at a power of between about 500 and 600 W. The gap filling third insulating layer 20 preferably has a thickness of between about 9000 and 10,000 Å.

Figure 5:
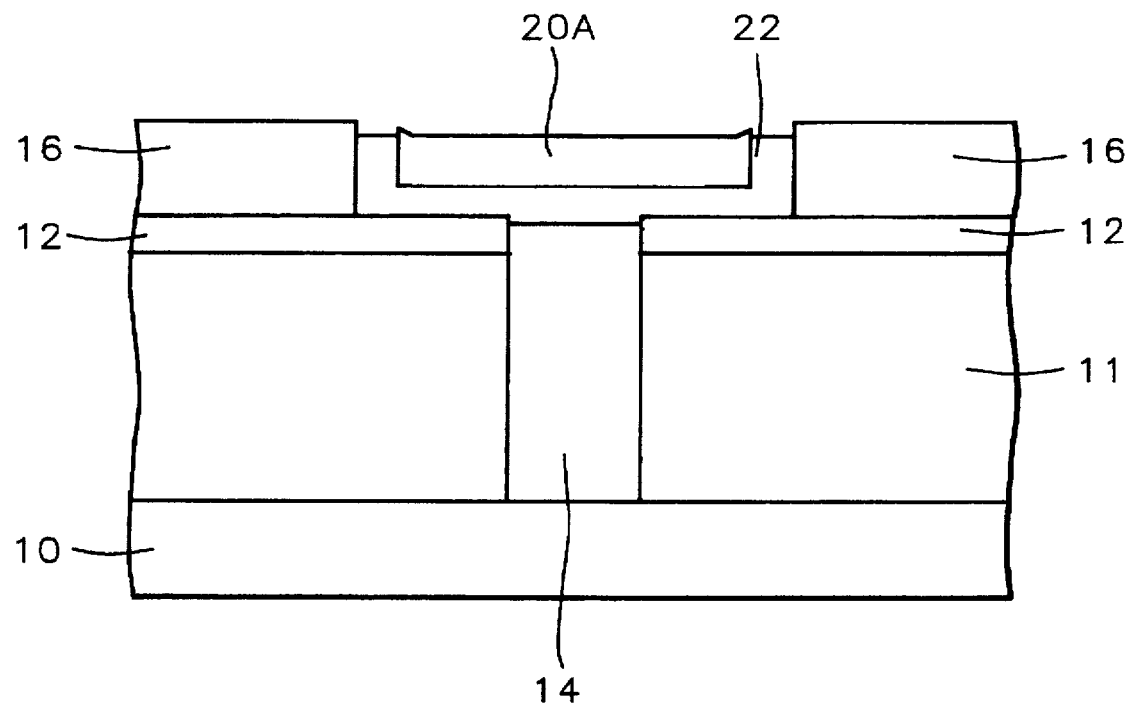
Figure 9:
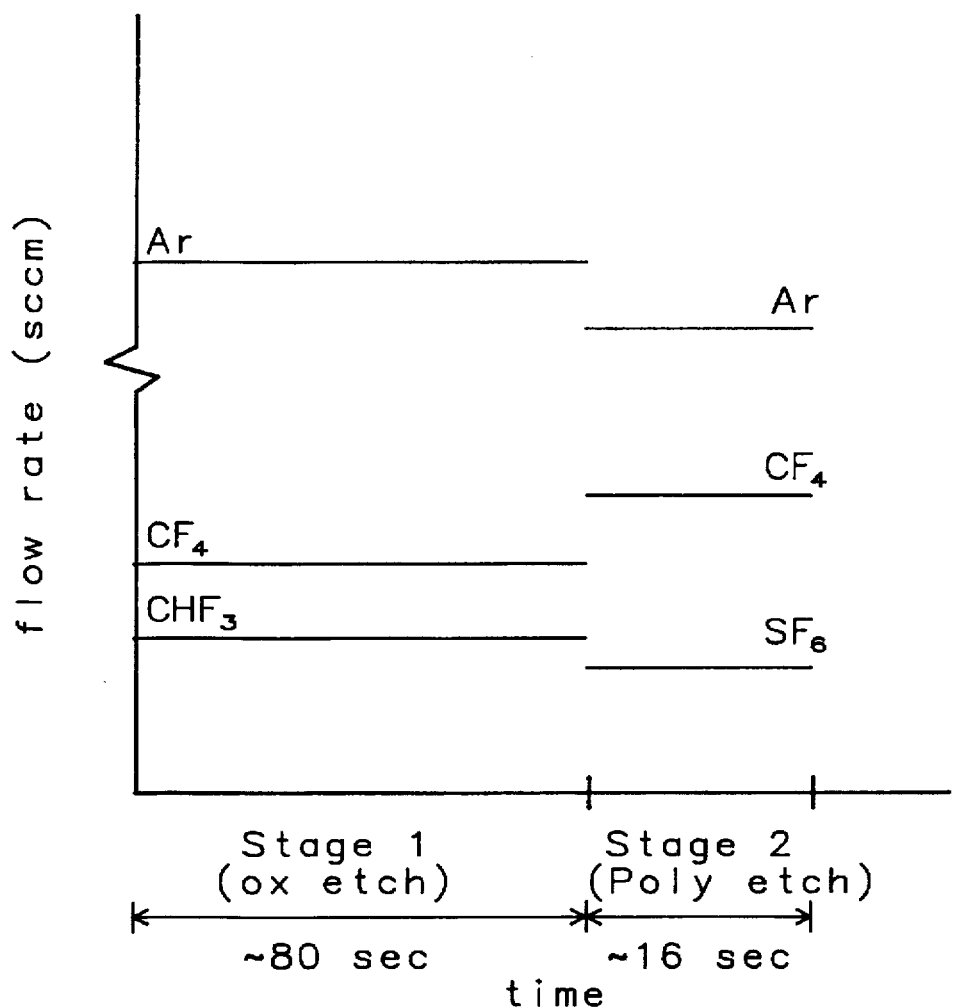
FIG. 9 is a graph illustrating the one step etch (2 stage) process according to the present invention.
Figure 9:
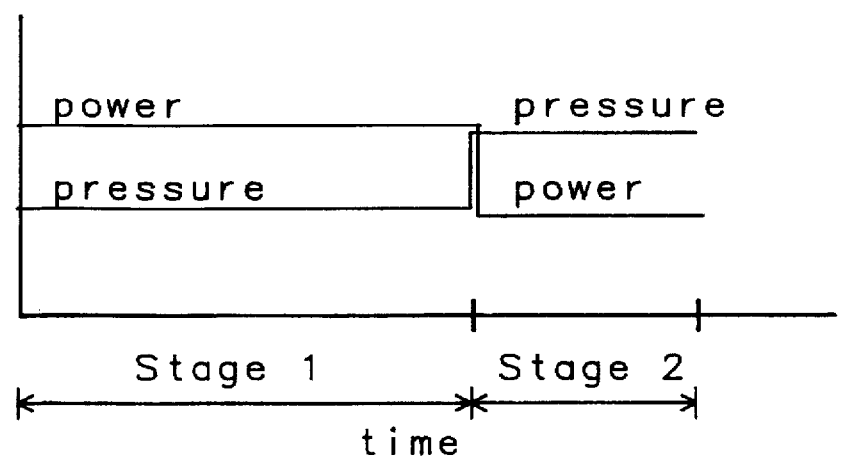

As shown in FIG. 5, in a key process, portions of the gap filling third insulating layer 20 and the polysilicon layer 18 are etched back in an one step etch process to form a polysilicon cylinder 22. The polysilicon cylinder preferably has a height of between about 4000 and 6000 Å. The one step etch leaves a remaining portion of the gap filling third insulating layer 20A inside the stacked cylinder 22. The top of the polysilicon cylinder is etched to a level below the top of the second insulating layer 16. The one step etch process is comprised of two stages: (1) an insulating layer etch stage and (2) a polysilicon etch stage. FIG. 9 shows the two etch stages. The insulating layer etch stage is performed using a plasma enhanced etch using $CHF_3$, $CF_4$, and Argon gasses, and the polysilicon etch stage is performed using $CF_4$, $SF_6$, and Argon gasses.

The insulating layer etch stage preferably uses: a $CHF_3$ flow rate of between about 30 and 40 sccm and more preferably 35 sccm, a $CF_4$ flow rate between about 40 and 50 sccm and more preferably 45 sccm, and an Argon flow rate of between about 500 and 900 sccm and more preferably 700 sccm, and at a pressure between about 700 and 900 mTorr and more preferably 800 mTorr, and a power of between about 1200 and 1400 W and more preferably 1300 W, and for a duration of between about 60 and 100 sec and more preferably 80 sec (depending on the thickness of gap filling third insulating layer 20). The etch has an over etch (OE) in a range of between about 5 to 20% of the duration.

The polysilicon etch stage preferably uses: a $SF_6$ flow rate of between about 15 and 50 sccm and more preferably 20 sccm, a $CF_4$ flow rate between about 55 and 80 sccm and more preferably 60 sccm, and an Argon flow rate of between about 500 and 800 sccm and more preferably 650 sccm, and a pressure between about 1000 and 1500 mTorr and more preferably. 1300 mTorr, and a power of between about 500 and 1000 W and more preferably 700 W, and for a duration of between about 10 and 20 sec and more preferably 16 sec. The etch has an over etch (OE) in a range of between about 5 to 20% of the duration. Both etch stages are ended by end point detection.

Figure 8A:
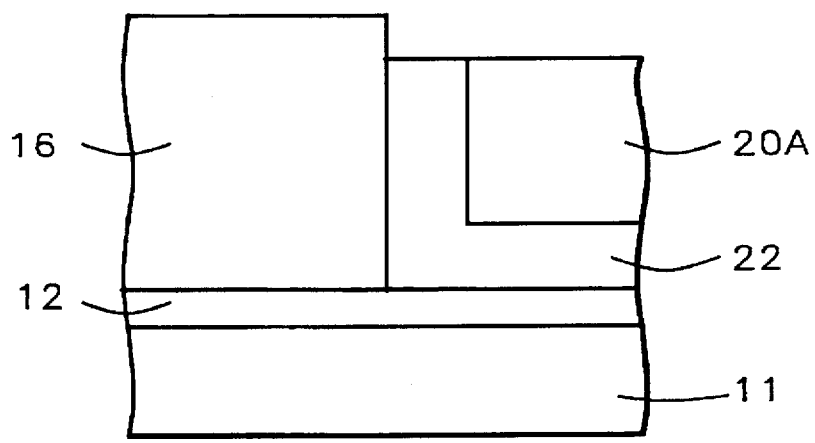
FIG. 8A is an expanded cross sectional view showing the smooth top surface of the cylinder electrode formed according to the present invention.
Figure 8B:
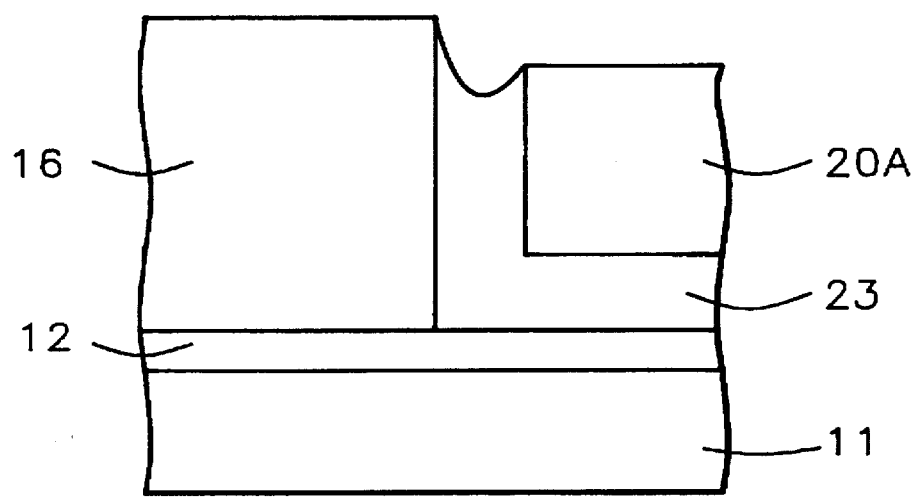
FIG. 8B is an expanded cross sectional view showing the uneven top surface of the cylinder electrode formed using a conventional etch.

The etch rate is controlled at around a 1:1 etch ratio for at least the polysilicon etch stage (PETEOS/Polysilicon interface etch) The etch ratio between the PETEOS:polysilicon is between about 0.9:1.0 and 1.0:0.9 and more preferably 1:1. This etch ratio is achieved by varying the ratio of $CF_4/SF_6$ flow rate, routinely monitoring the etch to ensure the etch rate is correct. The 1:1 ratio is important to ensure a smooth and flat polysilicon cylinder surface is achieved. FIG. 8A shows the smooth top surface of the polysilicon cylinder 22. FIG. 8B shows the uneven polysilicon cylinder 23 surface created by conventional etches.

Figure 6:
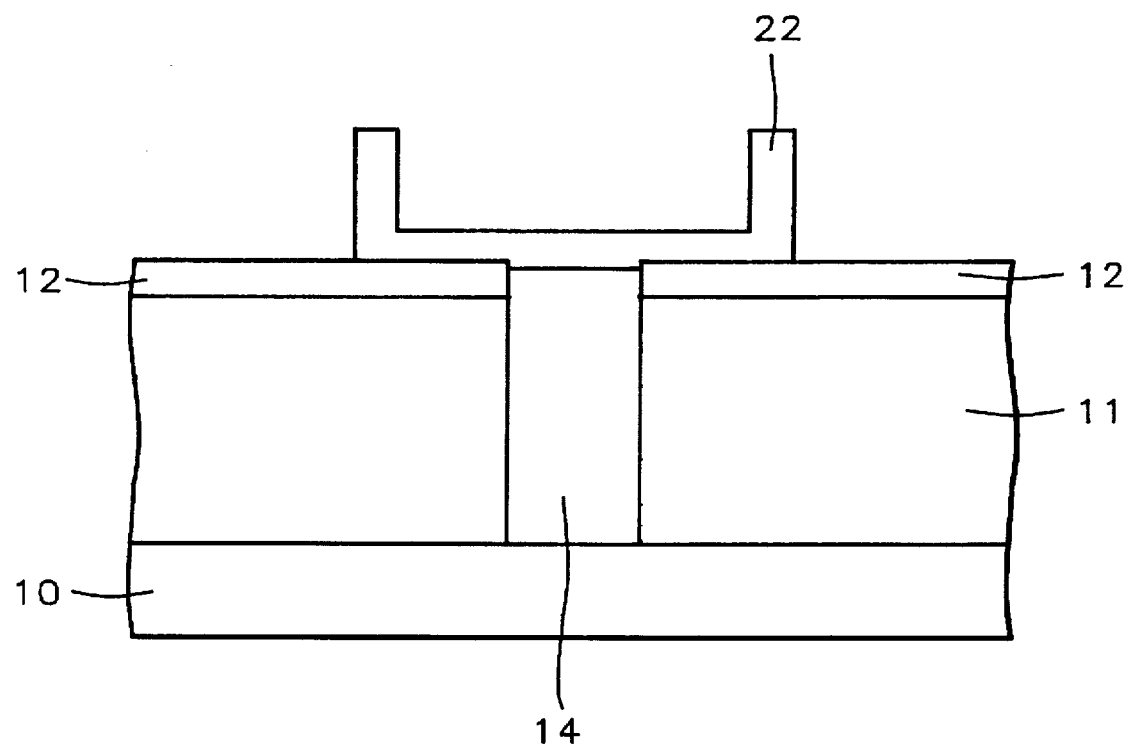

As shown in FIG. 6, the second insulating layer 16 and the third insulating layer 20 are then removed. The removal of the second insulating layer 16 and the gap filling third insulating layer 20 are preferably removed by a wet etch using a buffered oxide etch (BOE, e.g., $NH_4F+HF$) or HF chemicals.

The process of the present invention provides one step silicon oxide/polysilicon capacitor etch. The one step etch simplifies the polysilicon cylinder capacitor process. The one step etch replaces the convention separate steps: (1) oxide etch back, (2) a clean step (e.g. CR, Carol's clean, i.e. $H_2SO_4/H_2O_2$ mix) and (3) polysilicon etch.

The one step etch process provides a better smoother polysilicon cylinder surface. The one step process provides a better surface due to the chemistry ($CF_4/SF_6$) etch on the polysilicon surface. The one step etch provides superior control over cylinder height due to the smooth polysilicon surface.

What is claimed is:

1. A method of forming a polysilicon cylinder having a smooth top surface comprising;

a) providing a barrier layer over a first insulating layer on a semiconductor substrate, a polysilicon plug extending through said barrier layer and said insulating layer, a second insulating layer over portions of said barrier layer, said second insulating layer having an opening over said polysilicon plug and over portions of said barrier layer adjacent to said polysilicon plug, said opening defined by sidewalls of said second insulating layer, a polysilicon layer over said second insulating layer, over said sidewalls of said second insulating layer, over said portions of said barrier layer adjacent to said polysilicon plug and over said polysilicon plug, a gap filling third insulating layer over said polysilicon layer;

b) etching back portions of said gap filling third insulating layer and said polysilicon layer in a one step etch process to form a polysilicon cylinder; said one step etch process comprised of two stages: (1) an insulating layer etch stage and (2) a polysilicon etch stage, said insulating layer etch stage comprising a plasma enhanced etch using $CHF_3$, $CF_4$, and Argon gasses, and said polysilicon etch stage using $CF_4$, $SF_6$, and Argon gasses; and c) removing said second insulating layer and said gap filling third insulating layer.

2. The method of claim 1 wherein said insulating layer etch stage comprises: a $CHF_3$ flow rate of between about 30 and 40 sccm, a $CF_4$ flow rate of between about 40 and 50 sccm, and an Argon flow rate of between about 500 and 900 sccm and at a pressure of between about 700 and 900 mTorr and a power of between about 1200 and 1400 watts and for a duration of between about 60 and 100 sec;

and said polysilicon etch stage comprises: a $SF_6$ flow rate of between about 15 and 50 sccm, an $CF_4$ flow rate of between about 55 and 80 sccm, and an Argon flow rate of between about 500 and 800 sccm and at a pressure of between about 1000 and 1500 mTorr and at a power of between about 500 and 1000 watts and for a duration of between about 10 and 20 sec.

3. The method of claim 1 wherein said second insulting layer is PETEOS and said one step etch process comprises an etch ratio between PETEOS:polysilicon is between about 0.9:1.1 and 1.1:0.9.

4. The method of claim 1 wherein said barrier layer has a thickness in the range of between about 500 and 1500 Å.

5. The method of claim 1 wherein said second insulating layer has a thickness in a range of between about 4000 and 6000 Å.

6. The method of claim 1 wherein said polysilicon layer has a thickness of between about 800 and 1200 Å.

7. The method of claim 1 wherein said gap filling third insulating layer is composed of silicon oxide.

8. The method of claim 1 wherein the removal of said second insulating layer and said gap filling third insulating layer comprises a wet etch using a buffered oxide etch.

9. The method of claim 1 wherein said substrate further includes a source and said polysilicon plug contacts said source.

10. The method of claim 1 wherein said polysilicon cylinder has a height of between about 4000 and 6000 Å.

11. A method of forming a polysilicon cylinder having a smooth top surface in a DRAM cell comprising;

a) providing a barrier layer over a first insulating layer on a substrate, said barrier layer composed of silicon nitride, said first insulating layer composed of silicon oxide, a polysilicon plug extending through a plug opening in said barrier layer and said first insulating layer contacting said substrate;

b) forming a second insulating layer composed of silicon oxide over said barrier layer and said polysilicon plug;

c) etching said second insulating layer forming a cylindrical opening over said polysilicon plug and exposing portions of said barrier layer; said cylindrical opening defined by sidewalls of said second insulating layer;

d) depositing a polysilicon layer over said second insulating layer, over said sidewalls of said second insulating layer, over said polysilicon plug, and over exposed portions of said barrier layer;

e) depositing a gap filling third insulating layer composed of silicon oxide over said polysilicon layer (18);

f) etching back portions of said gap filling third insulating layer and said polysilicon layer in a one step etch process to form a polysilicon cylinder, said one step etch process comprising two stages: (1) an insulating layer etch stage and (2) a polysilicon etch stage, said insulating layer etch stage comprising a plasma enhanced etch using $CHF_3$, $CF_4$, and Argon gasses, said polysilicon etch stage using $CF_4$, $SF_6$, and Argon gasses; and g) removing said second insulating layer and said gap filling third insulating layer.

12. The method of claim 11 wherein said barrier layer has a thickness in the range of between about 500 and 1500 Å.

13. The method of claim 11 wherein said second insulating layer is deposited by a plasma enhanced tetraethylorthosilicate (PETEOS) process at a pressure of between about 7 and 8 Torr, at a temperature of between about 400° and 450° C., at a power of between about 500 and 600 W, and using gasses comprising of tetraethylorthosilicate (TEOS) and Helium, and said second insulating layer has a thickness in a range of between about 4000 and 6000 Å.

14. The method of claim 11 wherein the etching of said second insulating layer is performed by anisotropic reactive ion etching with Argon (Ar)+carbon tetrafluoride ($CF_4$)+ Nitrogen ($N_2$) at a pressure of between about 275 and 330 mTorr, at a power of between about 1250 and 1350 watts, using $CF_4$ at a flow rate of between about 75 and 85 sccm, using Ar at a flow rate of between about 550 and 650 sccm, and using $N_2$ at a flow rate of between about 90 and 110 sccm and an electrode spacing of between about 0.9 and 1.1 cm.

15. The method of claim 11 wherein said polysilicon layer is deposited by low pressure chemical vapor deposition (LPCVD) to a thickness of between about 800 and 1200 Å.

16. The method of claim 11 wherein said gap filling third insulating layer is deposited by a plasma enhanced tetraethylorthosilicate (PETEOS) process at a pressure of between about 7 and 8 Torr, at a temperature of between about 400° and 450° C., at a power of between about 500 and 600 watts, and using gasses comprising of tetraethylorthosilicate (TEOS) and Helium.

17. The method of claim 11 wherein said insulating layer etch stage comprises: a $CHF_3$ flow rate of between about 30 and 40 sccm, a $CF_4$ flow rate of between about 40 and 50 sccm, and an Argon flow rate of between about 500 and 900 sccm and at a pressure of between about 700 and 900 mTorr and a power of between about 1200 and 1400 watts and for a duration of between about 60 and 100 sec, and said polysilicon etch stage comprises: a $SF_6$ flow rate of between about 15 and 50 sccm, a $CF_4$ flow rate of between about 55 and 80 sccm, and an Argon flow rate of between about 500 and 800 sccm and at a pressure of between about 1000 and 1500 mTorr and at a power of between about 500 and 1000 watts and for a duration of between about 10 and 20 sec.

18. The method of claim 13 wherein said one step etch process comprises an etch ratio between PETEOS:polysilicon is between about 0.9:1.1 and 1.1:0.9.

19. The method of claim 11 wherein the removal of said second insulating layer and said gap filling third insulating layer comprising of a wet etch using a buffered oxide etch.

20. The method of claim 11 wherein said substrate further includes a source and said polysilicon plug contacts said source.

21. The method of claim 11 wherein said polysilicon cylinder has a height of between about 4000 and 6000 Å.

* * * * *